United States Patent [19]

Beneking

[11] Patent Number: 4,774,195

[45] Date of Patent: Sep. 27, 1988

[54] PROCESS FOR THE MANUFACTURE OF SEMICONDUCTOR LAYERS ON SEMICONDUCTOR BODIES OR FOR THE DIFFUSION OF IMPURITIES FROM COMPOUNDS INTO SEMICONDUCTOR BODIES UTILIZING AN ADDITIONAL GENERATION OF ACTIVATED HYDROGEN

[75] Inventor: Heinz Beneking, Aachen, Fed. Rep. of Germany

[73] Assignee: Telefunken Electronic GmbH, Heilbronn, Fed. Rep. of Germany

[21] Appl. No.: 761,383

[22] Filed: Aug. 1, 1985

[30] Foreign Application Priority Data

Oct. 10, 1984 [DE] Fed. Rep. of Germany ....... 3437120

[51] Int. Cl.$^4$ ...................... H01L 21/20; H01L 21/22
[52] U.S. Cl. .............................. 437/16; 148/DIG. 71; 204/DIG. 11; 204/157.3; 204/157.41; 427/53.1; 427/54.1; 427/55; 427/56.1; 437/18; 437/85; 437/165; 437/173
[58] Field of Search ............... 29/576 B; 148/1.5, 186, 148/189, DIG. 71; 427/53.1, 54.1, 55, 56.1, 85; 204/157.1 R, DIG. 11; 437/16, 18, 85, 165, 173

[56] References Cited

U.S. PATENT DOCUMENTS

| | | | |
|---|---|---|---|
| 3,351,503 | 11/1967 | Fotland | 148/188 |
| 3,661,637 | 5/1972 | Sirtl | 148/175 X |
| 4,340,617 | 7/1982 | Deutsch et al. | 427/53.1 |
| 4,483,725 | 11/1984 | Chang | 148/175 |
| 4,546,008 | 10/1985 | Saitoh et al. | 427/86 X |

FOREIGN PATENT DOCUMENTS

| | | |
|---|---|---|
| 1072815 | 1/1960 | Fed. Rep. of Germany . |
| 1906203 | 11/1969 | Fed. Rep. of Germany . |
| 1544284 | 3/1970 | Fed. Rep. of Germany . |
| 1900116 | 8/1970 | Fed. Rep. of Germany . |
| 2944118 | 5/1981 | Fed. Rep. of Germany . |
| 3000802 | 7/1981 | Fed. Rep. of Germany . |
| 3212653 | 10/1983 | Fed. Rep. of Germany . |
| 3335107 | 4/1984 | Fed. Rep. of Germany . |
| 2950846 | 1/1985 | Fed. Rep. of Germany . |

OTHER PUBLICATIONS

Deutsch et al., "Efficient Si Solar—Photochemical Doping", Appl. Phys. Letters, vol. 38(3), 1 Feb. 1981, pp. 144–146.

McWilliams et al., "Wafer-Scale Laser Pantography—Reactions", Appl. Phys. Ltrs., vol. 43(10), 15 Nov. 1983, pp. 946–948.

Fogarassy et al., "Solar Cells—Laser Induced Diffusion—", Proc.-Third European Photovoltaic Solar Energy Conf., Oct. 1980, pp. 639–645.

Turner et al., "Gas-Immersion Laser Diffusion—Solar Cells", Proc.-4th European Conf. Photovoltaic Solar Energy Conf., May 1982, pp. 427–431.

Morosanu et al., "Thin Film Preparation—Plasma—CVD—Reactor", Vacuum, vol. 31, No. 7 (Gt. Britain), pp. 309–313.

V. M. Donnelly et al, "Excimer Laser Induced Deposition of InP and Indium-oxide Films", Appl. Phys. Lett., 44(10), May 15, 1984, pp. 951–953.

M. Wautelet et al., "Laser-Enhanced Crystallization of Ge and Si", Journal of Crystal Growth, 65 (1983), pp. 231–234.

P. K. Boyer et al., "Laser-Induced Chemical Vapor Deposition of SiO$_2$", Appl. Phys. Lett., 40(8), Apr. 15, 1982, pp. 716–719.

Primary Examiner—William G. Saba

[57] ABSTRACT

The invention relates to a process for the manufacture of semiconductor layers on semiconductor bodies or for the diffusion of impurities from compounds into semiconductor bodies, with fission products which are to be withdrawn during the process being formed. The gist of the invention is that the reactivity of certain fission products is increased by plasma excitation or by the supplying of photons. In particular, active hydrogen is made available for entry into a highly volatile, gaseous combination with existing fission products.

18 Claims, No Drawings

PROCESS FOR THE MANUFACTURE OF SEMICONDUCTOR LAYERS ON SEMICONDUCTOR BODIES OR FOR THE DIFFUSION OF IMPURITIES FROM COMPOUNDS INTO SEMICONDUCTOR BODIES UTILIZING AN ADDITIONAL GENERATION OF ACTIVATED HYDROGEN

BACKGROUND OF THE INVENTION

The invention relates to a process for the manufacture of semiconductor layers on semiconductor bodies or for the diffusion of impurities from compounds into semiconductor bodies, with fission products which are to be withdrawn during the process being formed. The deposition of epitaxial semiconductor layers from the gaseous phase or the diffusion of impurities, for example, from surface layers or from adsorbates at the surface of a semiconductor body, often involves the problem of the formation of reaction products which are incorporated into the semiconductor layers where they cause disturbing electrical properties in the components to be manufactured. In cases where, for example, adsorbates are used an impurity source, the fission products occurring impede the necessary formation of further adsorbates so that only limited impurity concentrations or penetration depths of the doping materials are attainable.

In the epitaxial deposition of silicon layers from chlorosilane, the incorporation of chlorine atoms into the growing silicon layer has proven to be very disturbing. The incorporation of chlorine is caused by the relatively high adherence quotient of the chlorine molecules at the semiconductor surface. These chlorine molecules form, during the splitting-up of chlorosilane, as undesired fission products which are to be withdrawn or removed.

SUMMARY OF THE INVENTION

The object underlying the invention is therefore to indicate a process for the manufacture of semiconductor layers on semiconductor bodies or for the diffusion of impurities from compounds into semiconductor bodies, wherein the fission products formed do not have a disturbing influence on the performance of the processes and on the electrical properties of the components to be manufactured. This object is attained in that the reactivity of certain fission products is increased by plasma excitation or by the supplying of photons.

In a laser-controlled diffusion process, for example, active ions are produced by plasma excitation and enter into highly volatile and gaseous combinations with fission products so that these disturbing fission products are rapidly eliminated. The active ions are preferably atomic hydrogen, which, in addition to the aforementioned plasma excitation, may also be produced by chemical secondary processes or by the irradiation of photons of certain energy.

DESCRIPTION OF THE PREFERRED EMBODIMENTS

The invention and its advantageous execution will now be explained in greater detail with reference to practical examples.

It is known that chlorosilane may be used for the epitaxial production of monocrystalline silicon semiconductor layers, in particular, on monocrystalline silicon semiconductor bodies. In this case, the fact that the remaining fission product chlorine is incorporated into the epitaxial silicon layers with an inpurity density which is too high has a disturbing effect. The disturbing chlorine may be withdrawn by the formation of HCl. This HCl formation does, however, take place too slowly in a hydrogen atmosphere since hydrogen molecules must first be split up into two active hydrogen atoms. In accordance with the invention, provision is made for the decomposition process of the chlorosilane $SiCl_2H_2$ into silicon and HCl to take place in a plasma discharge space. In this case, the substrate may be used as an electrode for the discharge volume. The hydrogen released during the decomposition of the chlorosilane or a hydroen carrier gas is transferred at least partially by the plasma discharge into atomic active hydrogen which combines very rapidly with the released chlorine to form the highly volatile HCl gas. In this way, it was possible to substantially reduce the incorporation rate of chlorine into epitaxially grown silicon layers.

In another known process, there is disposed onto the surface of a semiconductor body an extremely thin adsorbate of only a few atomic layers in thickness containing an impurity material which is to be incorporated into the semiconductor body to produce a certain conduction type and a desired doping. This adsorbate is, for example, a metalorganic compound which is cracked by the action of light. The impurity material is released by this cracking process, but undesired fission products which must be withdrawn are formed. It is also possible to grow epitaxial semiconductor layers from adsorbates, with a new adsorbate being produced on the semiconductor surface after each cracking process, so that a layer of desired thickness may be produced by a plurality of successive cracking and deposition processes.

Also in the manufacture of epitaxial silicon from chlorosilane there is first formed on the semiconductor surface an adsorbate layer of silicon chloride. This silicon chloride layer may be split up by the action of light, so that the silicon remains on the semiconductor surface and the fission product chlorine which is formed may be converted into HCl and withdrawn by the combination with the atomic hydrogen which has been made available.

To dope semiconductor bodies consisting of III/V compounds with zinc there is disposed, for example, onto the surface of the semiconductor substrate a very thin layer of diethyl zinc $Zn(C_2H_5)_2$ which is cracked by the irradiation of laser light. To this end, there is directed onto the semiconductor surface a laser beam in pulse operation which splits up the diethyl zinc layer into zinc and $C_2H_5$ at the locations of impact, with the zinc being diffused into the semiconductor body. In this way, semiconductor zones with a depth of approximately 50 nm and an impurity concentration of $3 \cdot 10^{19}$ atoms/cm$^3$ may be produced. An activated hydrogen atom must be added to the $C_2H_5$ radicals formed during the cracking process so as to ensure rapid withdrawl of the carbon compounds which are formed. This active hydrogen may again be produced by the formation of a hydrogen plasma.

In the epitaxial deposition of gallium arsenide layers on semiconductor substrates from the gaseous phase, trimethyl gallium $(CH_3)_3Ga$ and arsenide $AsH_3$ are often used. In the chemical converstions taking place during the epitaxial process, the $CH_3$ which forms must be converted as rapidly as possible into $CH_4$ in order to avoid decomposition of $CH_3$ into carbon and hydrogen. The carbon would incorporate itself into the gallium arsenide layer which is formed and would, as a rule, cause a disturbing effect there. In order to avoid this disturbing effect, atomic active hydrogen is again made available and is converted with the $CH_3$ released during the epitaxial process into the highly volatile $CH_4$. The atomic active hydrogen may again be produced in a hydrogen plasma or by decomposition of a hydrogen compound with the aid of a laser beam or incident photons. Atomic hydrogen is produced, for example, in the decomposition of germane $GeH_4$. In this case, GeH and a hydrogen atom are first produced. The GeH is then decomposed into germanium and a further hydrogen atom. The germanium serves, for example, in the production of semiconductor layers consisting of III/V compounds, as a doping material, while the simultaneously produced active hydrogen combines in the aforementioned process with $CH_3$ to form $CH_4$.

In the increasing of the reactivity and evaporating ability of fission products by the supplying of photons, their energy should preferably be above 1.8 eV, since only in this wavelength range is there sufficient energy available to split up the bonds of molecules and transfer these molecules into a metastable state in which a dissociation is possible.

What is claimed is:

1. In a process for producing semiconductor layers on semiconductor bodies or for diffusing impurities into semiconductor bodies from compounds, wherein the fission products formed during the process are chemically converted and removed; the improvement wherein activated hydrogen is generated by means of plasma excitation or by the addition of photons, with said activated hydrogen reacting extremely quickly with certain of the fission products to convert them into easily volatilized compounds, and wherein the plasma excitation or the addition of photons for generating the activated hydrogen is in addition to the process being used for the production of semiconductor layers or for the diffusion of impurities.

2. Process according to claim 1, wherein: said process is a laser-controlled diffusion process; and said activated hydrogen is generated by plasma excitation.

3. Process according to claim 1, wherein: said process is the epitaxial deposition of silicon semiconductor layers from the gaseous phase by decomposition of chlorosilane; and said active hydrogen is made available by production of a hydrogen plasma and enters into a highly volatile, gaseous combination with the chlorine or the chlorine compounds formed.

4. Process according to claim 2, wherein said process includes disposing an adsorbate containing the doping material on the surface of a semiconductor body, and heating this adsorbate at selected locations for a short time and in such a way with a laser beam that the doping material is released and penetrates into the semiconductor body, while further fission products enter into a gaseous and high volatile combination with said activated hydrogen.

5. Process according to claim 2, used for the diffusion of zinc from diethyl zinc $Zn(C_2H_5)_2$ into semiconductor bodies consisting of III/V compounds.

6. Process according to claim 1 used for the epitaxial deposition of GaAs from trimethyl gallium and arsine, with said activated hydrogen being made available for the formation of highly volatile $CH_4$.

7. Process according to claim 1, wherein said activated hydrogen is generated by the addition of photons with the energy of the incident photons being above 1.8 eV.

8. A process according to claim 1 wherein said activated hydrogen is generated by plasma excitation.

9. A process according to claim 1 wherein said activated hydrogen is generated from hydrogen gas or a further hydrogen containing compound supplied during said process.

10. A process according to claim 1 wherein said activated hydrogen is generated from a fission product.

11. In a process for diffusing impurities from chemical compounds into the semiconductor bodies including the steps of decomposing a selected chemical compound containing the impurity, chemically converting undesired decomposition by-products formed during said decomposition step to highly volatile gaseous compounds by reaction with hydrogen, and removing said gaseous compounds from said process; the improvement wherein said step of chemically converting further includes separately generating atomic hydrogen by means of plasma excitation or by the addition of photons during said step of decomposing and in addition to the method used for said step of decomposing.

12. A process as defined in claim 11 wherein said atomic hydrogen is generated by plasma excitation.

13. A process as defined in claim 11 wherein said activated hydrogen is generated from hydrogen gas or a further hydrogen containing compound supplied during said step of decomposing.

14. A process as defined in claim 11 wherein said activated hydrogen is generated from a decomposition by-product.

15. In a process for epitaxially producing a semiconductor layer on the surface of a semiconductor body including the steps of decomposing at least one selected chemical compound to produce the semiconductor material of the semiconductor layer, chemically converting undesired decomposition by-products formed during said decomposition step to high volatile gaseous compounds by reaction with hydrogen, and removing said gaseous compounds from said process; the improvement wherein said step of chemically converting further includes separately generating atomic hydrogen by means of plasma excitation or by the addition of photons during said step of decomposing, and in addition to the method used for said step of decomposing.

16. A process as defined in claim 15 wherein said atomic hydrogen is generated by plasma excitation.

17. A process as defined in claim 15 wherein said activated hydrogen is generated from hydrogen gas or a further hydrogen containing compound supplied during said step of decomposing.

18. A process as defined in claim 15 wherein said activated hydrogen is generated from a decomposition by-product.

* * * * *